United States Patent
Yu et al.

(10) Patent No.: US 8,803,333 B2
(45) Date of Patent: Aug. 12, 2014

(54) THREE-DIMENSIONAL CHIP STACK AND METHOD OF FORMING THE SAME

(75) Inventors: Chen-Hua Yu, Hsinchu (TW); Da-Yuan Shih, Hsinchu (TW); Chih-Hang Tung, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/544,746

(22) Filed: Jul. 9, 2012

(65) Prior Publication Data

US 2013/0307144 A1 Nov. 21, 2013

Related U.S. Application Data

(60) Provisional application No. 61/649,097, filed on May 18, 2012.

(51) Int. Cl.
| | |
|---|---|
| *H01L 29/40* | (2006.01) |
| *H01L 23/48* | (2006.01) |
| *H01L 23/52* | (2006.01) |
| *H01L 23/488* | (2006.01) |

(52) U.S. Cl.
CPC .............. *H01L 23/48* (2013.01); *H01L 23/488* (2013.01); *H01L 23/52* (2013.01)
USPC ........................................................ 257/777

(58) Field of Classification Search
CPC .... H01L 23/48; H01L 23/23488; H01L 23/52
USPC ........... 257/777, 778, 737, E23.021, E23.141
See application file for complete search history.

(56) References Cited

U.S. PATENT DOCUMENTS

| | | | |
|---|---|---|---|
| 6,681,982 B2 | 1/2004 | Tung | |
| 7,276,801 B2 | 10/2007 | Dubin et al. | |
| 7,476,564 B2 | 1/2009 | Chen et al. | |
| 2006/0094226 A1 | 5/2006 | Huang et al. | |
| 2007/0184579 A1 | 8/2007 | Huang et al. | |
| 2008/0230896 A1 | 9/2008 | Zhong et al. | |
| 2009/0233436 A1 | 9/2009 | Kim et al. | |
| 2010/0133688 A1* | 6/2010 | Shigihara et al. ............. | 257/738 |
| 2012/0032329 A1* | 2/2012 | Shigihara et al. ............. | 257/738 |
| 2012/0273928 A1* | 11/2012 | Kim ............................. | 257/668 |

FOREIGN PATENT DOCUMENTS

KR 2011-009372 1/2011

OTHER PUBLICATIONS

Lin, Yu-Min et al., "Low Temperature Bonding of 30um Pitch Micro Bump Interconnection for 3D IC Stacking Using Non-Conductive Adhesive", International Microsystem, Packaging, Assembly and Circuits Technology Conference, Oct. 2011, pp. 478-481.
Islam, M. N. et al., "Comparative Study of the Dissolution Kinetics of Electrolytic Ni and Electroless Ni-P by the Molten Sn3.5Ag0.5Cu Solder Alloy", Microelectronics Reliability 43 (2003) 2031-2037.
Office Action dated Feb. 18, 2014 and English translation from corresponding application No. KR 10-2012-0147340.

* cited by examiner

*Primary Examiner* — Long K Tran
(74) *Attorney, Agent, or Firm* — Lowe Hauptman & Ham, LLP

(57) ABSTRACT

A three dimensional (3D) chip stack includes a first chip bonded to a second chip. The first chip includes a first bump structure overlying the first substrate, and the second chip includes a second bump structure overlying the second substrate. The first bump structure is attached to the second bump structure, and a joining region is formed between the first bump structure and the second bump structure. The joining region is a solderless region which includes a noble metal.

20 Claims, 8 Drawing Sheets

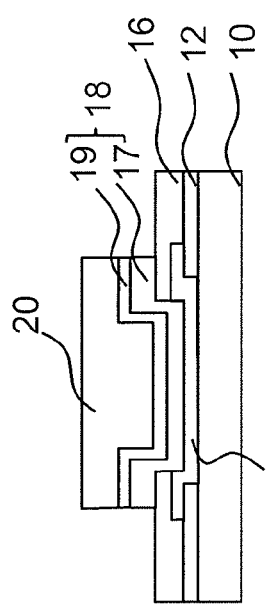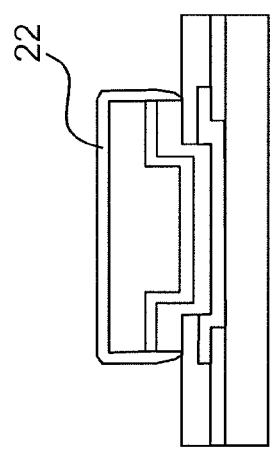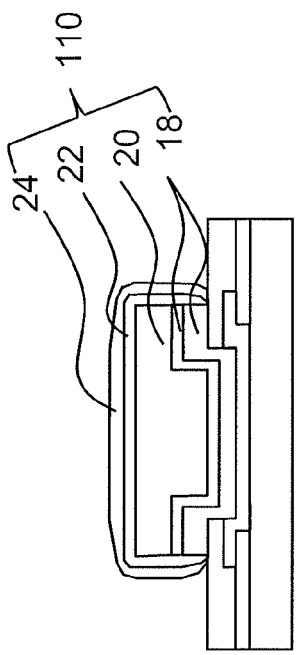

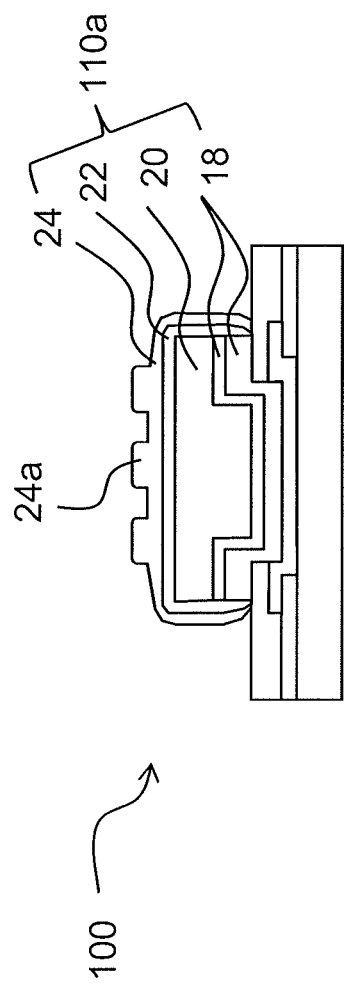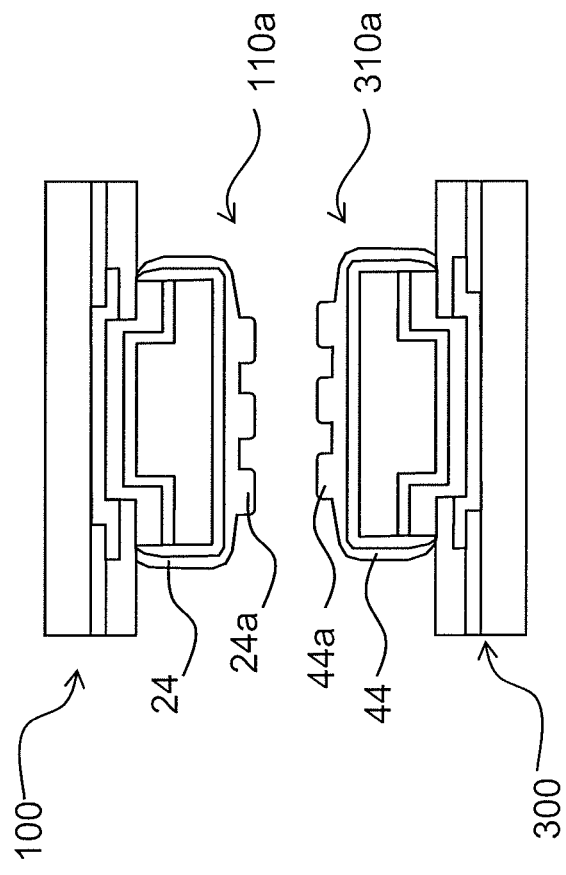

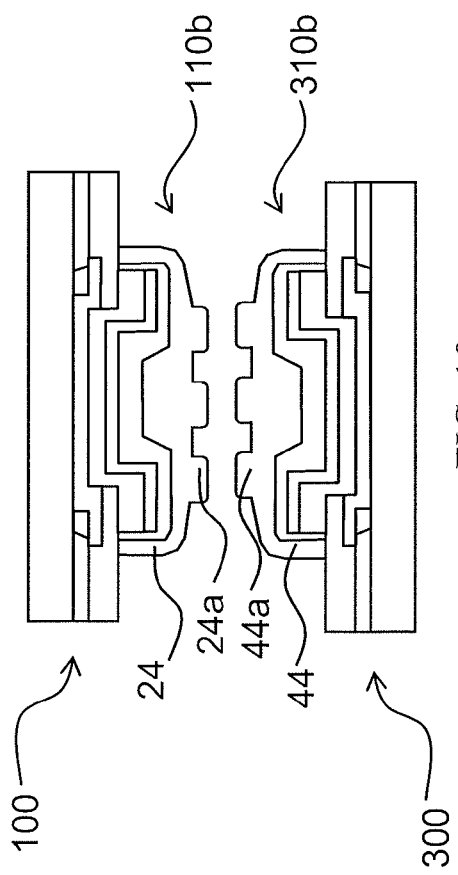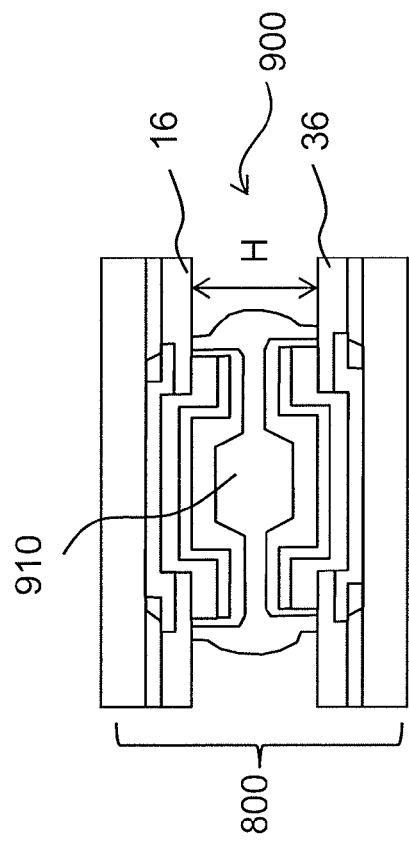

THREE-DIMENSIONAL CHIP STACK AND METHOD OF FORMING THE SAME

CROSS-REFERENCE TO RELATED APPLICATION

The present application claims the priority of U.S. Provisional Application No. 61/649,097, filed May 18, 2012, which is incorporated by reference herein in its entirety.

TECHNICAL FIELD

This disclosure relates to chip-to-chip bonding technologies, and more particularly to three-dimensional chip stacks and a method of forming the same.

BACKGROUND

In an attempt to further increase circuit density, three-dimensional integrated circuits (3DICs) have been investigated. In a typical formation process of a 3D IC, two chips are bonded together and electrical connections are formed between each chip and contact pads on a substrate. For example, bonding two chips on top of each other. The stacked chips were then bonded to a carrier substrate and wire bonds electrically coupled contact pads on each chip to contact pads on the carrier substrate. However, this requires a carrier substrate larger than the chips for the wire bonding. More recent attempts have focused on flip-chip interconnections and the use of conductive balls/bumps to form a connection between the chip and the underlying substrate, thereby allowing high-wiring density in a relatively small package. Traditional chip stacking using solder joints involves solder, flux and underfill. All these processes created issues and limitations on pitch, joint height, and flux residue.

DESCRIPTION OF THE DRAWINGS

FIGS. 1-5 are cross-sectional views at various stages of manufacturing a three dimensional (3D) chip stack according to one or more embodiments;

FIGS. 6-8 are cross-sectional views at various stages of manufacturing a 3D chip stack according to one or more embodiments;

FIGS. 9-11 are cross-sectional views at various stages of manufacturing a 3D chip stack according to one or more embodiments;

DETAILED DESCRIPTION

Figure 4:
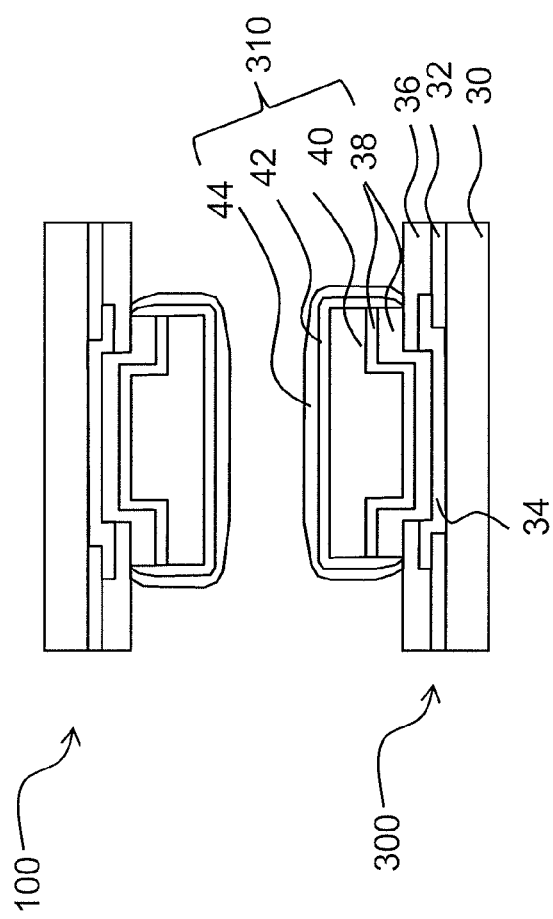

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details. In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

Embodiments of the present disclosure are related to three dimensional (3D) chip stacks that utilize solderless bonding metallurgy, such as a gold-to-gold bonding, noble metal-to-noble metal bonding and/or gold-to-noble metal bonding technologies. Some embodiments of the present disclosure are related to the gold-to-gold bonding formed between metal pillars and/or metal pads on semiconductor chips. Methods of forming 3D chip stacks will be described herein.

FIGS. 1-5 are cross-sectional views at various stages of manufacturing a 3D chip stack according to at least one embodiment.

Referring to FIG. 1, a first chip 100 includes a first semiconductor substrate 10 employed in a semiconductor integrated circuit fabrication, and integrated circuits may be formed therein and/or thereupon. The first semiconductor substrate 10 is defined to mean any construction comprising semiconductor materials including, but not limited to, bulk silicon, a semiconductor wafer, a silicon-on-insulator (SOI) substrate, or a silicon germanium substrate. Other semiconductor materials including group III, group IV, and group V elements may also be used. The first semiconductor substrate 10 may further comprise a plurality of isolation features (not shown), such as shallow trench isolation (STI) features or local oxidation of silicon (LOCOS) features. Examples of the various microelectronic elements that may be formed in the first semiconductor substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and other suitable types of devices. The first semiconductor substrate 10 further includes inter-layer dielectric layers (not shown) and a metallization structure (not shown) overlying the integrated circuits. The inter-layer dielectric layers and the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One of ordinary skill in the art will realize the formation details of the metallization layers.

A first passivation layer 12 may be formed of a dielectric material, such as polyimide, polymer, an oxide, a nitride, or the like, and patterned over a surface of the first semiconductor substrate 10 to protect underlying layers from various environmental contaminants. In at least one embodiment, the first passivation layer 12 includes a silicon nitride layer, a silicon oxide layer, and/or a composite layer of a layer of silicon nitride and an oxide layer. A pad region 14 is a metallization layer formed on a top-level inter-layer dielectric layer, which may extend to the first passivation layer 12 and may be a portion of conductive routes. Suitable materials for the pad region 14 may include, but are not limited to, for example copper (Cu), aluminum (Al), AlCu, copper alloy, or other mobile conductive materials. The pad region 14 provides an electrical connection upon which an under-bump metallization (UBM) structure may be formed for external connections in subsequent processing steps.

A second passivation layer 16 is formed on the substrate 10 and patterned to form an opening exposing a portion of the pad region 14 for allowing subsequent UBM formation. In at least one embodiment, the second passivation layer 16 is formed of a non-organic material selected from un-doped silicate glass (USG), silicon nitride, silicon oxynitride, silicon oxide, and combinations thereof. In at least another embodiment, the second passivation layer 16 is formed of a polymer layer, such as an epoxy, polyimide, benzocyclobutene (BCB), polybenzoxazole (PBO), and the like, although other relatively soft, often organic, dielectric materials can also be used.

FIG. 1 also depicts an under-bump metallization (UBM) layer 18 and a metal pillar 20 on the resulted structure so as to electrically connect the pad region 14. In at least one embodiment, the UBM layer 18 is formed on the second passivation layer 16 and the exposed portion of the pad region 14. For example, the UBM layer 18 includes a diffusion barrier layer 17, which is formed of titanium, tantalum, titanium nitride, tantalum nitride, or the like. The UBM layer 18 may further include a copper layer 19 formed on the diffusion barrier layer 17. The copper layer 19 may be formed of copper alloys that include silver, chromium, nickel, tin, gold, and combinations thereof.

The formation of the metal pillar 20 is performed on the UBM layer 18, for example, through photoresist masking, photolithography, plating, and dry/wet etching processes. In at least one embodiment, metal pillar 20 is intended to include a layer including substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In at least one exemplary embodiment, the thickness of the metal pillar 20 is greater than 25 μm. In another exemplary embodiment, the thickness of the metal pillar 20 is greater than 40 μm. For example, the metal pillar 20 is of about 40~50 μm thickness, about 45 μm thickness, or about 40~70 μm thickness, although the thickness may be greater or smaller.

Referring to FIG. 2, a protection layer 22 is formed on the metal pillar 20. The protection layer 22 may extend to sidewalls of the metal pillar 20 and sidewalls of the UBM layer 18. The protection layer 22 may include different materials and layers, and may be used to prevent the oxidation and the diffusion of metal pillar 20 to/from a bonding layer. The protection layer 22 is a metal layer, which may be formed by plating, for example an electroplating process from an electrolytic bath. The metal to be deposited is not particularly limited. The metal may be nickel (Ni), copper (Cu), silver (Ag), gold (Au), palladium (Pd), platinum (Pt), tin (Sn), zinc (Zn), Ruthenium (Ru), a noble metal, or a combination of these. In at least one embodiment, the protection layer 22 is a nickel (Ni) layer formed through a nickel electroplating process that involves placing the first chip 100 as a cathode in an electrolytic bath.

As shown in FIG. 3, a bonding layer 24 is formed on a surface of the protection layer 22. In at least one embodiment, the bonding layer 24 is a solderless metal layer. In an embodiment, the bonding layer 24 is a noble metal layer, including gold (Au), palladium (Pd), Platinum (Pt), silver (Ag), hodium (Rh), Ruthenium (Ru), Iridium (Ir), Osmium (Os), and their alloys. In at least one embodiment, the bonding layer 24 includes a gold layer or a gold alloy layer formed by plating methods. In at least one embodiment, the bonding layer 24 has a thickness greater than or equal to about 0.5 μm. The gold layer may be formed using methods including electroless plating, immersion, and the like. The first chip 100 includes a first bump structure 110 including the UBM layer 18, the metal pillar 20, the protection layer 22 and the bonding layer 24 on the pad region 14 of the first semiconductor substrate 10, employed as a first interconnect structure for attaching to another interconnect structure of another chip.

After the bump formation, the first chip 100 may be bonded to another chip through chip-to-wafer level stacking or chip-to-chip level stacking or the like. It should be noted, however, that embodiments may be used in many different situations. For example, embodiments may be used in a chip-to-chip bonding configuration, a chip-to-wafer bonding configuration, chip-level packaging, or the like.

As shown in FIG. 4, the first chip 100 is bonded to a second chip 300 through flip-chip bonding. For purposes of illustration, the first chip 100 is flipped down toward the second chip 300 such that the first bump structure 110 faces a second bump structure 310 of the second chip 300. In this example, the second chip 300 includes a second semiconductor substrate 30, a passivation layer 32, a pad region 34, a passivation layer 36 and a second bump structure 310. The second bump structure 310 includes an UBM layer 38, a metal pillar 40, a protection layer 42 and a bonding layer 44, employed as a second interconnect structure of the second chip 300 for attaching to the first interconnect structure of the first chip 100. In at least one embodiment, the bonding layer 44 is a noble metal layer including gold (Au) palladium (Pd), Platinum (Pt), silver (Ag), hodium (Rh), Ruthenium (Ru), Iridium (Ir), Osmium (Os), and their alloys. In at least one embodiment, the bonding layer 44 is a gold layer or a gold alloy layer. Any suitable process and materials may be used to form the structures in the second chip 300, and those may be similar to or the same as the formation in the first chip 100. In at least one embodiment, processes and materials used to form the second bump structure 310 may be similar to or the same as the formation of the first bump structure 110.

Figure 5:
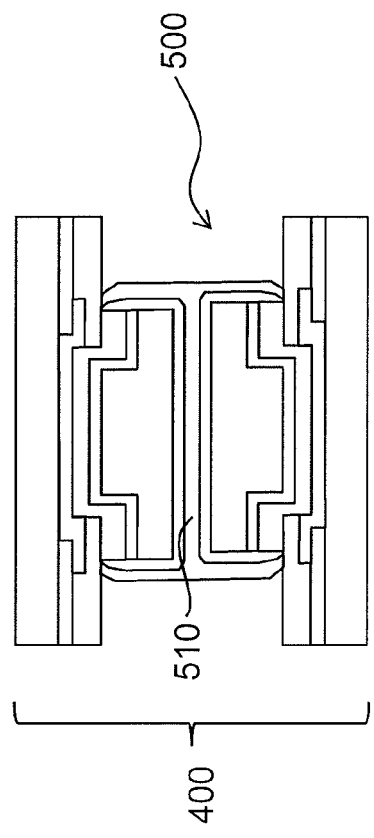

With reference to FIG. 5, a bonding process is performed to bond the chips 100 and 300 by attaching the first bump structure 110 to the second bump structure 310 through the bonding layers 24 and 44, and therefore a 3D chip stack 400 is formed with a solderless joining structure 500 therein. The bonding process may include a low temperature and/or low pressure bonding process with or without an ultrasonic-assisted process, in which solder and flux materials and solder reflow steps are not used in the bonding process. In at least one embodiment, the solderless joining structure 500 includes a joining region 510 formed by attaching the bonding layer 24 to the bonding layer 44 and positioned between the protection layers 22 and 42. The joining region 510 is a solderless region which may include the noble metal formed in at least one of the bonding layers 24 and 44. In at least one embodiment, the region 510 includes gold or noble metal. The joining region 510 has a thickness greater than or equal to about 0.5 μm. For example, the joining region 510 has a thickness greater than or equal to about 1 μm.

The 3D chip stack 400 includes the solderless joining structure 500 formed by attaching the bonding layers 24 and 44 between metal pillars 20 and 40. The metal pillars 20 and 40 are the bumps projecting from the substrates 10 and 30 respectively, which can achieve fine pitch joining and sustain bonding height. The bonding layers 24 and 44 of soft material layers sitting on the metal pillars 20 and 24 of hard materials can function as glue layers and provide good electrical bonding strength and can be formed of proper thickness and roughness to reduce possible boding failures. The 3D chip stack 400 utilizing the noble metal layers as the bonding layers 24 and 44 can be formed by a dry, clean, high throughput, and high yield chip stacking process in comparison with conventional techniques.

Figure 8:
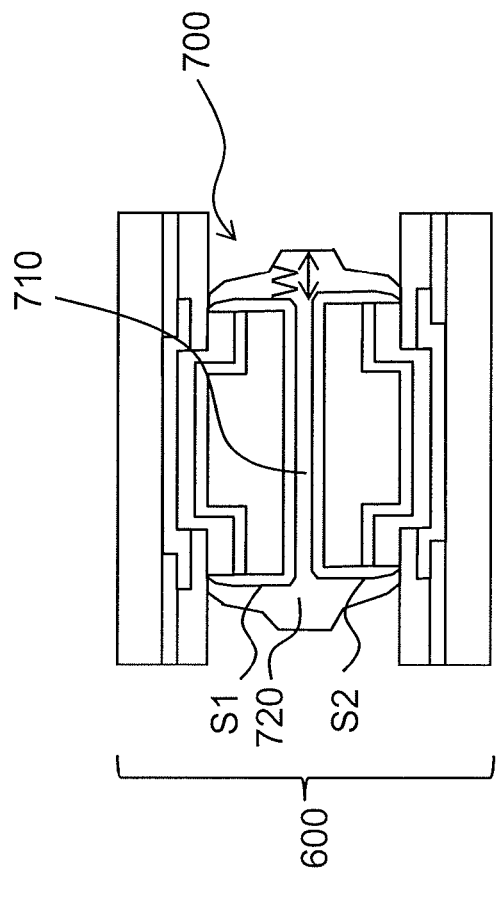

Some embodiments of the present disclosure are related to the bonding layers 24 and 44 formed of proper topography to reduce boding force. Methods of forming 3D chip stacks will be described herein. FIGS. 6-8 are cross-sectional views at various stages of manufacturing a 3D chip stack according to at least one embodiment, wherein like reference numerals refer to like elements.

With reference to FIG. 6, the formation of the first bump structure 110a of the first chip 100 includes forming the bonding layer 24 with a hump 24a. In at least one embodiment, the bonding layer 24 has discrete humps 24a that may be positioned over a top surface of the metal pillar 20. There is a space between two adjacent humps 24a, and the dimension of the space is not limited in the present disclosure. In at least one embodiment, the hump 24a can be formed by plating with photolithography and etching processes. In another embodiment, the hump 24a can be formed by stud bonding processes. In an example of forming a gold hump, a gold wire ball bonder is used to form a gold stud bump on a gold layer followed by a coining process to smooth the end of the gold stud bump, such that a gold hump is formed. The same process can be conducted in case that a noble metal stud hump is used instead of the gold hump. In at least one embodiment, the material of the hump 24a is the same as the material of the bonding layer 24. In some embodiments, the hump 24a is formed of a noble metal material that is different from the material of the bonding layer 24.

As shown in FIG. 7, the first chip 100 with the first bump structure 110a is bonded to the second chip 300 with the second bump structure 310a through flip-chip bonding. In at least one embodiment, the second bump structure 310a includes humps 44a on the bonding layer 44. Any suitable process and materials may be used to form the second bump structure 310a in the second chip 300, and those may be similar to or the same as the formation of the first bump structure 110a in the first chip 100. In at least one embodiment, processes and materials used to form the humps 44a of the second bump structure 30a may be similar to or the same as the formation of the humps 24a of the first bump structure 110a.

With reference to FIG. 8, a bonding process is performed to bond the chips 100 and 300 through the bonding layers 24 and 44 and the humps 24a and 44a, and therefore a 3D chip stack 600 is formed with a solderless joining structure 700 therein. The bonding process may include a low temperature and/or low pressure bonding process with or without the ultrasonic-assisted process, in which solder and flux materials not used in the bonding process. In at least one embodiment, the solderless joining structure 700 includes a solderless joining region 710 formed by attaching the bonding layer 24 with the humps 24a to the bonding layer 44 with the humps 44a and positioned between the protection layers 22 and 42. The joining region 710 may include the noble metal formed in the bonding layers 24 and 44 and/or the humps 24a and 44a. In at least one embodiment, the solderless joining region 710 includes gold or noble metal. The solderless joining region 710 has a thickness greater than or equal to about 0.5 μm. For example, the joining region 510 has a thickness greater than or equal to about 1 μm. In at least one embodiment, the joining region 710 further includes a protrusion region 720 which is a portion of the joining region 710 laterally extending to protrude from exterior sidewalls of the bump structures 110a and 310a. The protrusion region 720 may laterally extend to protrude from exterior sidewalls S1 and S2 of the protection layers 22 and 42. In at least one embodiment, the lateral dimension W of the protrusion region 720 is greater than or equal to about 0.5 μm. For example, the lateral dimension W is greater than or equal to 1 μm. In some embodiments, the lateral dimension W is greater than or equal to 2 μm.

Figure 9:
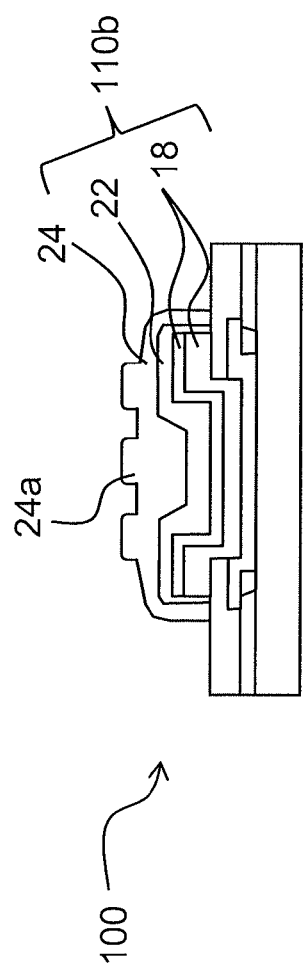

Some embodiments of the present disclosure are related to the bonding layers 24 and 44 formed of proper topography over the pad region 14 to lower a stand-off height and form a thinner chip stack. Methods of forming 3D chip stacks will be described herein. FIGS. 9-11 are cross-sectional views at various stages of manufacturing a 3D chip stack according to at least one embodiment, wherein like reference numerals refer to like elements.

With reference to FIG. 9, in the first chip 100, the step of forming the metal pillar 20 is omitted, and the protection layer 22 is directly formed on the UBM layer 18 followed by the formation of the bonding layer 24 with humps 24a. The first chip 100 includes the first bump structure 110b with reduced height.

As shown in FIG. 10, the first chip 100 with the first bump structure 110b is bonded to the second chip 300 with the second bump structure 310b through flip-chip bonding, in which metal pillars are not formed in the bump structures 110b and 310b. In at least one embodiment, the second bump structure 310b includes the protection layer 42 directly formed on the UBM layer 38 followed by the formation of the bonding layer 44 with humps 44a. Any suitable process and materials may be used to form the second bump structure 310b in the second chip 300, and those may be similar to or the same as the formation of the first bump structure 110b in the first chip 100.

With reference to FIG. 11, a bonding process is performed to bond the chips 100 and 300 through bump structures 110b and 310b, and therefore a 3D chip stack 800 is formed with a solderless joining structure 900 therein. The bonding process may include a low temperature and/or low pressure bonding process with or without the ultrasonic-assisted process, in which solder and flux materials not used in the bonding process. In at least one embodiment, the solderless joining structure 900 includes a joining region 910 formed by attaching the bonding layer 24 with the humps 24a to the bonding layer 44 with the humps 44a and positioned between the protection layers 22 and 42. The joining region 910 may include the noble metal formed in the bonding layers 24 and 44 and/or the humps 24a and 44a. Since the metal pillars are not formed in the chips 100 and 300, the stand-off height H (also referring to as the height between the passivation layers 16 and 36) between the first chip 100 and the second chip 300 in the 3D chip stack 800 is reduced. In at least one embodiment, the height H is less than or equal to about 5 μm.

Some embodiments of the present disclosure are related to 3D chip stack with seal ring structure to protect the chip surface. FIGS. 12-14 are schematic views of 3D chip stacks with sealing structures according to embodiments, wherein like reference numerals refer to like elements.

Figure 12A:
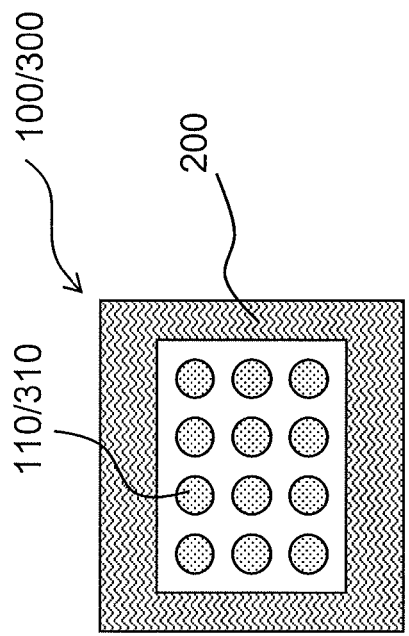
FIG. 12A is a top view of a sealing structure according to one or more embodiments.
Figure 12B:
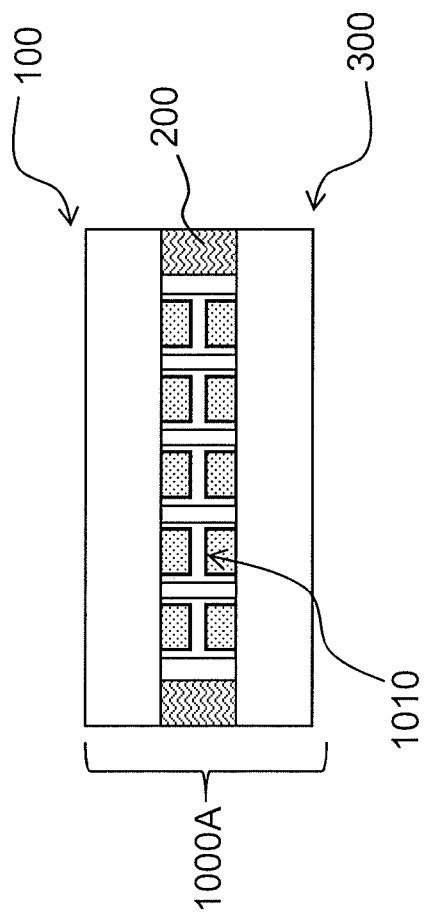
FIG. 12B is a cross-sectional view of a 3D chip stack with the sealing structure according to the embodiment shown in FIG. 12A.

FIG. 12A is a top view of a sealing structure according to at least one embodiment, and FIG. 12B is a cross-sectional view of 3D chip stacks with the sealing structure according to the at least one embodiment shown in FIG. 12A.

In at least one embodiment, an organic material such as an underfill, epoxy, polyimide or polymer material is formed on at least one of the peripheral regions of the chips 100 and 300 during the bonding process. After the bonding process, the organic material becomes a seal ring structure 200 in a 3D chip stack 1000A. In at least one embodiment, the seal ring structure 200 is formed on the peripheral regions of the space between the chips 100 and 300. The seal ring structure 200 can protect the chip surface and prevent moisture and/or particles from entering the chip surface, thus reliability issues in the 3D chip stack 1000A can be solved.

Figure 13A:
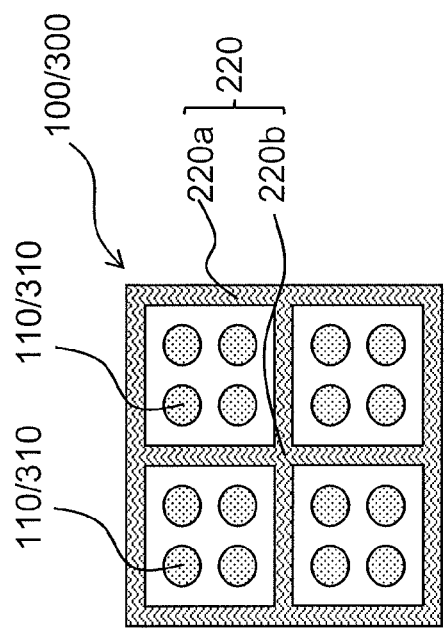
FIG. 13A is a top view of a sealing structure according to one or more embodiments.
Figure 13B:
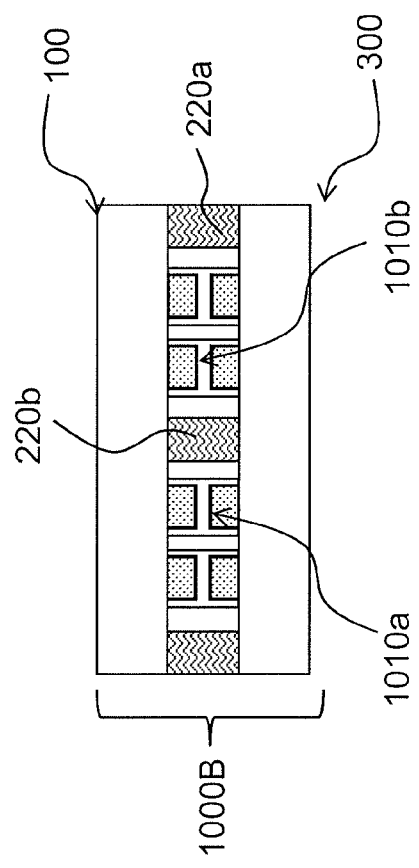
FIG. 13B is a cross-sectional view of a 3D chip stack with the sealing structure according to the embodiment shown in FIG. 13A.
Figure 14:
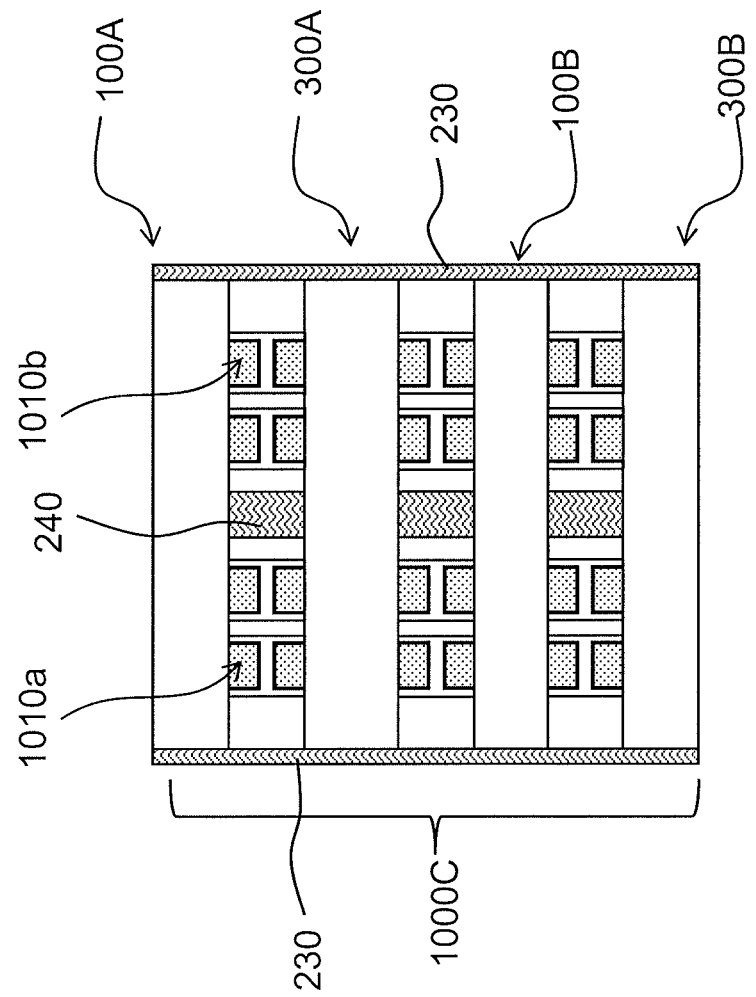
FIG. 14 is a cross-sectional view of a 3D chip stack with a sealing structure according to one or more embodiments.

FIG. 13A is a top view of a sealing structure according to at least one embodiment, and FIG. 13B is a cross-sectional view of 3D chip stacks with the seal ring structure according to the at least one embodiment shown in FIG. 13A.

In addition to the peripheral region of the chip 100 and/or 300, an organic material is formed on internal regions of the chip 100 and/or 300 to divide the chip into a plurality of areas. In at least one embodiment, the divided areas become a grid layout, and each divided area includes a plurality of bump structures 110 or 310. After the bonding process, the organic material becomes a sealing structure 220 in a 3D chip stack 1000B. In at least one embodiment, the sealing structure 220 includes a first sealing structure 220a and a second sealing structure 220b. The first sealing structure 220a is formed on the peripheral regions of the space between the chips 100 and 300. The second sealing structure 220b is formed on the internal regions of the space between the chips 100 and 300. In the 3D chip stack 1000B, the second sealing structure 220b separates the first group of solderless joining structures 1010a from the second group of solderless joining structures 1010b.

FIG. 14A is a cross-sectional view of 3D chip stacks with a sealing structure according to at least one embodiment.

In at least one embodiment, 3D chip stack 1000C includes at least one set of chip stack by bonding the two chips 100 and 300. In at least one embodiment, the 3D chip stack 1000C includes a first set of chip stack by bonding the two chips 100A and 300A, and a second set of chip stack by bonding the two chips 100B and 300B, wherein the two sets of chip stacks are bonded to each other by solderless joining structures. An organic material is formed on external sidewalls of the 3D chip stack 1000C to function as a sealing wall 230. In at least one embodiment, the sealing wall 230 is formed around the space between the chips 100A and 300A and/or around the space between the chips 100B and 300B, and/or around the space between the chips 100B and 300A. The sealing wall 230 may be formed on the exterior sidewalls of the stacked chips 100A, 300A, 100B and 300B in a continuous manner. In some embodiments, the 3D chip stack 1000C includes other sealing structures 240 in the space between two adjacent chips to separate groups of solderless joining structures 1010a and 1010b.

According to some embodiments, a device includes a first chip bonded to a second chip. The first chip includes a first bump structure overlying the first substrate, and the second chip includes a second bump structure overlying the second substrate. The first chip is bonded to the second chip by attaching the first bump structure to the second bump structure, and a joining region is formed between the first bump structure and the second bump structure. The joining region is a solderless region which includes a noble metal.

According to some embodiments, a device includes a first chip bonded to a second chip. The first chip includes a first semiconductor substrate, a first metal pillar overlying the first semiconductor substrate, a first protection layer overlying the first metal pillar, and a first bonding layer overlying the first protection layer. The second chip includes a second semiconductor substrate, a second metal pillar overlying the second semiconductor substrate, a second protection layer overlying the second metal pillar, and a second bonding layer overlying the second protection layer. The first chip is bonded to the second chip by attaching the first bonding layer to the second bonding layer, and a solderless joining region is formed between the first metal pillar and the second metal pillar. The solderless joining region includes a noble metal.

According to some embodiments, a device includes a first chip bonded to a second chip. The first chip includes a first metallization layer overlying a first passivation layer, a first protection layer overlying the first metallization layer, and a first bonding layer overlying the first protection layer. The second chip includes a second metallization layer overlying a second passivation layer, a second protection layer overlying the second metallization layer, and a second bonding layer overlying the second protection layer. The first bonding layer is attached to the second bonding layer to form a solderless joining region which has a thickness greater than or equal to 0.5 μm. The height between the first passivation layer and the second passivation layer is less than or equal to about 5 μm.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A device, comprising:
   a first chip comprising a first substrate and a first bump structure overlying the first substrate; and
   a second chip comprising a second substrate and a second bump structure overlying the second substrate, the first chip being bonded to the second chip by a solderless joint between the first bump structure and the second bump structure, the solderless joint having a joining region between the first bump structure and the second bump structure,
   wherein the joining region between the first chip and the second chip comprises a noble metal, the first bump structure comprises a metallization layer overlying the first substrate and a protection layer formed between the joining region and the metallization layer, and a region between the first and the second chip is free from an adhesive material.

2. The device of claim 1, wherein the joining region comprises gold.

3. The device of claim 1, wherein the protection layer comprises nickel.

4. The device of claim 3, wherein the first bump structure comprises a metal pillar positioned between the first metallization layer and the first protection layer.

5. The device of claim 4, wherein the metal pillar comprises copper, and the first metallization layer comprises at least one of titanium, tantalum or copper.

6. The device of claim 1, wherein the joining region has a thickness greater than or equal to 0.5 μm.

7. The device of claim 1, wherein the joining region comprises a protrusion region which protrudes from an exterior sidewall of the first bump structure or an exterior sidewall of the second bump structure.

8. The device of claim 7, wherein the protrusion region has a lateral dimension greater than or equal to 0.5 μm.

9. The device of claim 1, wherein the first chip comprises a first passivation layer formed between the first substrate and the first bump structure, the second chip comprises a second passivation layer formed between the second substrate and the second bump structure, and the height between the first passivation layer and the second passivation layer is less than or equal to about 5 μm.

10. The device of claim 1, further comprising a sealing structure formed in a space between the first chip and the second chip.

11. The device of claim 10, wherein the sealing structure comprises a seal ring on a peripheral region of the first chip or the peripheral region of the second chip.

12. The device of claim 10, wherein the sealing structure is formed in an internal region in the space between the first chip and the second chip.

13. The device of claim 1, further comprising a sealing wall surrounding the space between the first chip and the second chip.

14. A device, comprising:
a first chip comprising a first semiconductor substrate, a first metal pillar overlying the first semiconductor substrate, a first protection layer overlying the first metal pillar, and a first bonding layer overlying the first protection layer; and
a second chip comprising a second semiconductor substrate, a second metal pillar overlying the second semiconductor substrate, a second protection layer overlying the second metal pillar, and a second bonding layer overlying the second protection layer the first chip being bonded to the second chip by the first bonding layer and the second bonding layer, the first bonding layer and the second bonding layer forming a solderless joint between the first metal pillar and the second metal pillar,
wherein the solderless joint has a joining region between the first chip and the second chip that comprises a noble metal, and a region between the first and the second chip is free from an adhesive material.

15. The device of claim 14, wherein at least one of the first protection layer and the second protection layer comprises a nickel layer.

16. The device of claim 14, wherein at least one of the first metal pillar and the second metal pillar comprises a copper pillar.

17. The device of claim 14, wherein the solderless joining region has a thickness greater than or equal to 0.5 μm.

18. The device of claim 14, wherein each of the first bonding layer and the second bonding layer comprises a gold layer.

19. A device, comprising:
a first chip bonded to a second chip, the first chip comprising:
a first metallization layer overlying a first passivation layer,
a first protection layer overlying the first metallization layer, and
a first bonding layer overlying the first protection layer;
the second chip comprising:
a second metallization layer overlying a second passivation layer;
a second protection layer overlying the second metallization layer; and
a second bonding layer overlying the second protection layer;
wherein the first chip is bonded to the second chip by the first bonding layer and the second bonding layer, the first bonding layer and the second bonding layer forming a solderless joint having a joining region between the first chip and the second chip, the joining region comprises a noble metal, a region between the first and the second chip is free from an adhesive material, and has a thickness greater than or equal to 0.5 μm; and
wherein the height between the first passivation layer and the second passivation layer is less than or equal to about 5 μm.

20. The device of claim 19, wherein at least one of the first bonding layer and the second bonding layer comprises a gold layer.

* * * * *